(12) United States Patent
Kuribayashi

(10) Patent No.: US 7,410,873 B2
(45) Date of Patent: Aug. 12, 2008

(54) METHOD OF MANUFACTURING A SEMICONDUCTOR DEVICE

(75) Inventor: Hitoshi Kuribayashi, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 10/400,171

(22) Filed: Mar. 26, 2003

(65) Prior Publication Data
US 2003/0219948 A1    Nov. 27, 2003

(30) Foreign Application Priority Data

| Mar. 26, 2002 | (JP) | ............................. 2002-086122 |
| Feb. 14, 2003 | (JP) | ............................. 2003-036685 |

(51) Int. Cl.
  *H01L 21/336* (2006.01)
(52) U.S. Cl. ................ 438/270; 438/758; 257/E21.428
(58) Field of Classification Search ................ 438/758, 438/770, 424, 906, 429, 700, 445, 296, 637, 438/672, 270; 257/E21.55, E21.428
See application file for complete search history.

(56) References Cited

U.S. PATENT DOCUMENTS

| 5,122,846 | A | * | 6/1992 | Haken ........................ 257/66 |
| 5,420,061 | A | * | 5/1995 | Manning .................... 438/218 |
| 5,455,190 | A | * | 10/1995 | Hsu ............................ 438/270 |
| 5,733,810 | A | * | 3/1998 | Baba et al. .................. 438/268 |
| 5,786,277 | A | * | 7/1998 | Yamamoto .................. 438/770 |
| 5,843,846 | A | * | 12/1998 | Nguyen et al. ............... 438/713 |
| 6,103,635 | A | * | 8/2000 | Chau et al. .................. 438/739 |
| 6,117,734 | A | * | 9/2000 | Nakamura .................. 438/268 |
| 6,228,727 | B1 | * | 5/2001 | Lim et al. .................... 438/296 |

(Continued)

FOREIGN PATENT DOCUMENTS

JP    10-012716    1/1998

(Continued)

OTHER PUBLICATIONS

Notice of Reasons for Rejection issued in corresponding Japanese patent application No. 2003-036685; partial translation provided.

*Primary Examiner*—Bradley W. Baumeister
*Assistant Examiner*—Igwe U. Anya
(74) *Attorney, Agent, or Firm*—Rossi, Kimms & McDowell LLP

(57) ABSTRACT

A method of forming a semiconductor device uses an anneal technique to planarize and round corners of a trench formed in a substrate. The substrate is annealed under a normal pressure in an inert atmosphere, such as an atmosphere containing one of argon, helium, and neon, or an atmosphere of a gas mixture of hydrogen of 4% or less and one of argon, helium, and neon at a temperature of between 900° C. and 1050° C. for a time of between 30 seconds and 30 minutes to round the trench corners and planarize the trench side walls. Alternatively, after removing a mask for forming the trench, the substrate can be annealed in the inert atmosphere. This provides easy and inexpensive way of planarizing the trench side walls, as well as rounding of the trench corners. Moreover, by removing the mask for forming the trench before annealing enables the semiconductor device to have a highly reliable gate insulator film with good reproducibility.

13 Claims, 9 Drawing Sheets

U.S. PATENT DOCUMENTS

| | | | |
|---|---|---|---|
| 6,291,310 B1 * | 9/2001 | Madson et al. | 438/424 |
| 6,362,025 B1 * | 3/2002 | Patti et al. | 438/138 |
| 6,387,756 B1 | 5/2002 | Muramatsu | |
| 6,429,481 B1 * | 8/2002 | Mo et al. | 257/341 |
| 6,511,886 B2 * | 1/2003 | Kim et al. | 438/270 |
| 6,515,317 B1 * | 2/2003 | Bazan et al. | 257/215 |
| 6,630,389 B2 * | 10/2003 | Shibata et al. | 438/424 |
| 6,746,933 B1 | 6/2004 | Beintner et al. | |
| 6,825,087 B1 * | 11/2004 | Sharp et al. | 438/296 |
| 2003/0042512 A1 * | 3/2003 | Gonzalez | 257/263 |
| 2003/0139012 A1 * | 7/2003 | Yamauchi et al. | 438/269 |
| 2004/0166642 A1 | 8/2004 | Chen et al. | |

FOREIGN PATENT DOCUMENTS

| | | | |
|---|---|---|---|
| JP | 11163298 A * | 6/1999 | |
| JP | 11-283977 A | 10/1999 | |
| JP | 2002-231945 | 8/2002 | |
| JP | 2003-229479 A | 8/2003 | |
| JP | 2003-282869 A | 10/2003 | |

* cited by examiner

METHOD OF MANUFACTURING A SEMICONDUCTOR DEVICE

BACKGROUND

A semiconductor device can have a gate insulator film formed in a trench (hereinafter referred to as a trench MOS semiconductor device). To form the trench MOS semiconductor device, after forming a trench on a semiconductor substrate, a gate insulator film is subsequently formed in the trench. FIG. 1 is a plan view showing an arrangement of a principal part of a trench MOS semiconductor device during its manufacture according to a related method developed by the present inventor. FIGS. 2A to 2E are cross sectional views taken along line II-II of FIG. 1, showing arrangements in successive steps of manufacturing the trench MOS semiconductor device. FIG. 2E corresponds to the view of FIG. 1.

In FIG. 1 and FIG. 2E, in each of trenches 4, a gate electrode 8 of polysilicon is formed on a gate oxide film 7 provided on a surface of the trench 4. The gate electrode 8 extends from an end of the trench 4 over a thick oxide film 9. On the gate electrode 8 provided over the thick oxide film 9, an interlayer insulator film (not shown) is formed. In the interlayer insulator film, a contact hole (not shown) is formed to connect the gate electrode 8 to a metal wiring (not shown).

In the related method, on a surface of an n-type silicon semiconductor substrate 1 provided with an $n^+$-drain 11, the thick oxide layer 9 is first formed. Thereafter, a p-type well region 2 is formed in a surface layer of the semiconductor substrate 1. On the surface of the well region 2, a mask 3 is formed with a silicon dioxide film having a desired pattern. The silicon semiconductor substrate 1 in an opening of the mask 3 is etched to form the trench 4 on the silicon semiconductor substrate 1. At this time, an $SiO_2$ side wall protective film 5 is formed on a side wall of the trench 4 (FIG. 2A). The side wall protective film 5 is then removed using an HF etchant. At this time, the mask 3 is set back from an edge of the trench 4 to widen the opening of the mask 3 (FIG. 2B). Thereafter, damages in the trench 4 are removed by isotropic etching. At this time, side walls 41 and 42 of the trench 4 are planarized and the bottom corners 43 and 44 of the trench are rounded (FIG. 2C). Subsequently, for the purpose of rounding corners at an upper part of the trench 4 and removing foreign materials, a sacrifice oxide film 6 is formed by thermal oxidation (FIG. 2D). By removing the sacrifice oxide film 6, the corners at the upper part of the trench 4 are rounded and the foreign materials in the trench 4 are removed. After this, the gate oxide film 7 is formed, and the trench 4 is filled with the gate electrode 8 of polycrystalline silicon, which is etched back with a region extending into the thick oxide film 9 (FIG. 2E). Then, by forming a source and associated regions, a trench MOS semiconductor device is formed.

In the above-explained related manufacturing method, however, for rounding the corners in the trench 4, the sacrifice oxide film 6 must be formed thick. Moreover, the isotropic etching, carried out after the side wall protective film 5 is removed, enlarges the width of the trench 4. The width of the trench 4 can vary depending on variation in an amount of set back of the mask 3 caused when the side wall protective film 5 is removed. This is unfavorable as it degrades the alignment accuracy of the mask to be used in the later step, and prevents micro fabrication.

In view of this problem, the present inventor devised a method by which, after a side wall protective film formed on a side wall of a trench is removed, annealing the trench in an atmosphere of hydrogen before a gate insulator film is formed to thereby round the corner of the trench, while planarizing the side wall of the trench without enlarging the width of the trench. A similar method is also described in JP-A-2002-231945. Such manufacturing methods, however, have disadvantages in that hydrogen handling is much troublesome and a heat treatment apparatus is expensive.

Furthermore, JP-A-2002-231945 also describes that, at the annealing processing under the atmosphere of hydrogen, the mask 3 for forming the trench 4 is set back similarly as shown in FIG. 2A for controlling a radius of curvature of an upper corner of the trench 4 by an amount of the set back.

In controlling the radius of curvature of the corner by setting back the mask 3, although the annealing treatment in the atmosphere of hydrogen performs planarization of the trench side walls 141 and 142 and rounding of the trench corners 143, 144, 145, and 146, diffusion of silicon atoms is restricted by the mask 3 at a boundary of the end of the mask 3 and an exposed portion of the semiconductor substrate 1, forming protrusions 10 (FIG. 3C). Thus formed protrusions 10, in the case of forming the gate electrode 8 on the gate oxide film 7 causes possible dielectric breakdowns at the protrusions 10.

Thus, in the arrangement where an electrode is buried in a trench with an insulator film put between the electrode and the trench, and the electrode is taken out onto a semiconductor substrate for connecting to metal wiring, there is a possibility of dielectric breakdown.

Accordingly, there is a need for a method of manufacturing a semiconductor device with high reproducibility, a semiconductor device having a highly reliable gate insulator film, capable of easily and inexpensively carrying out planarization processing of a gate insulator film forming region before forming a gate insulator film, and planarizing the trench side wall and rounding the trench corners. The present invention addresses this need.

SUMMARY OF THE INVENTION

The present invention relates to a method of manufacturing a semiconductor device, more particularly to a method of planarizing a surface, in particular the side wall of the trench, and rounding of trench corners.

One aspect of the present invention is a method of manufacturing a semiconductor device having an insulator gate structure. A gate insulator film forming region is formed on a semiconductor substrate. The gate insulator film forming region formed on the semiconductor substrate can be exposed. The substrate can be annealed in an inert atmosphere under a normal pressure to planarize the gate insulator film forming region. Thereafter, a gate insulator film can be formed in the gate insulator forming region.

According to another aspect of the present invention, a trench is formed on the semiconductor substrate. The substrate is then annealed in an inert atmosphere under a normal pressure.

According to another aspect of the present invention, a mask is formed on the semiconductor substrate. The trench is then formed by etching the substrate using the mask. The mask is then removed form the substrate. Then the substrate is annealed in an inert atmosphere.

The annealing step rounds the corners of the trench and planarizes the side walls of the trench. Removing the mask can expose the surface of the semiconductor substrate from the trench by a length of at least two times the radius of curvature of the corner rounded during annealing at an upper part of the trench.

The inert atmosphere can be an atmosphere containing one of argon, helium, and neon, or an atmosphere of a gas mixture containing hydrogen of 4% or less and one of argon, helium, and neon. Moreover, the substrate can be annealed at a temperature of between 900° C. and 1050° C. for a time of between 30 seconds and 30 minutes.

An insulator layer covering the side wall and a bottom face of the trench can be formed after annealing the substrate. An electrode can be formed to cover the insulator layer. The electrode can be formed in the trench and on a surface of the semiconductor substrate continuous with the trench, with the insulator layer formed under the electrode. A sacrifice oxide film can be formed after annealing the substrate, and can then be removed.

DETAILED DESCRIPTION

The following description refers to the drawings.

Figure 1:
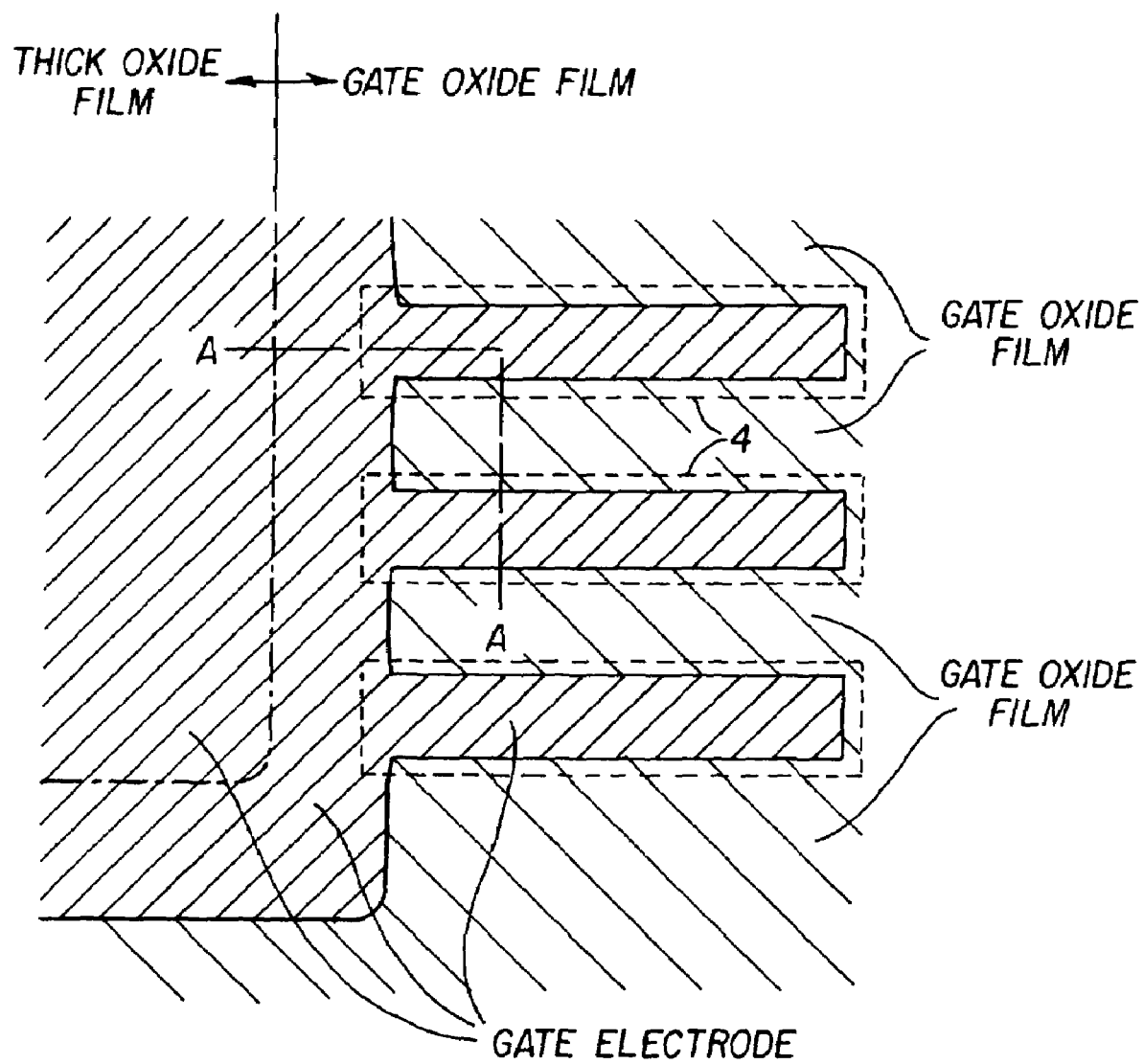
FIG. 1 is a plan view showing an arrangement of a principal part of a trench MOS semiconductor device in the course of manufacturing a semiconductor device according to a related method developed by the present inventor.
Figure 2A:
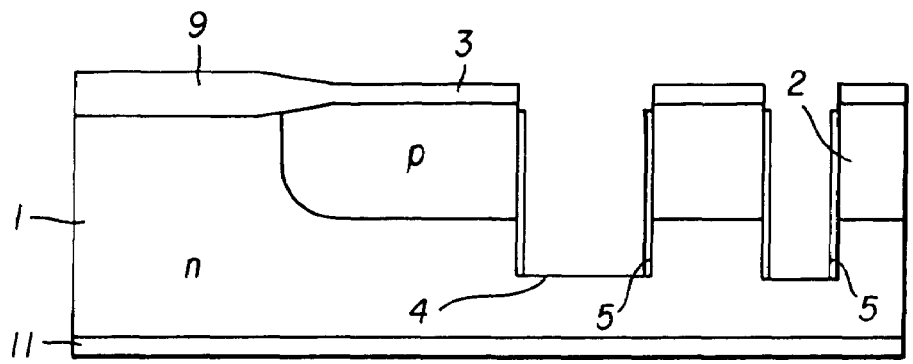
FIGS. 2A to 2E are cross sectional views taken along line II-II of FIG. 1 showing in successive steps, arrangements of the trench MOS semiconductor device in the course of manufacturing the semiconductor device according to the related method.
Figure 2B:
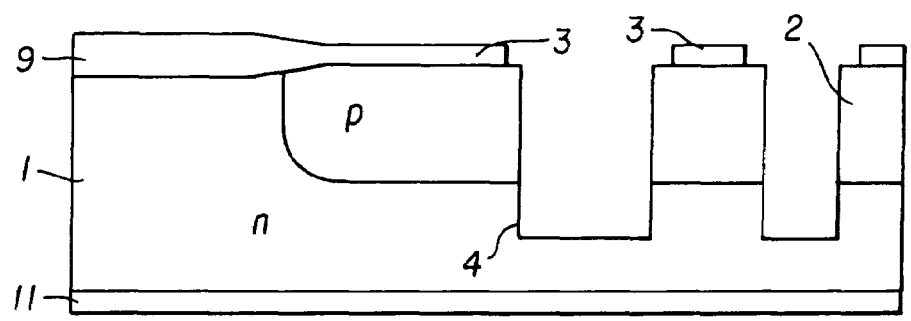
Figure 2C:
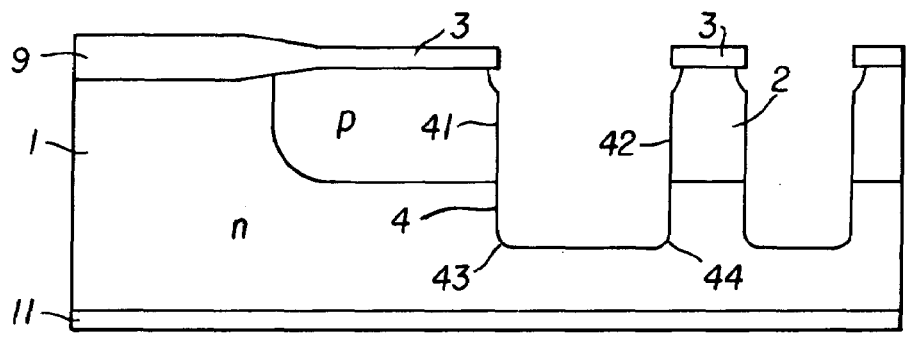
Figure 2D:
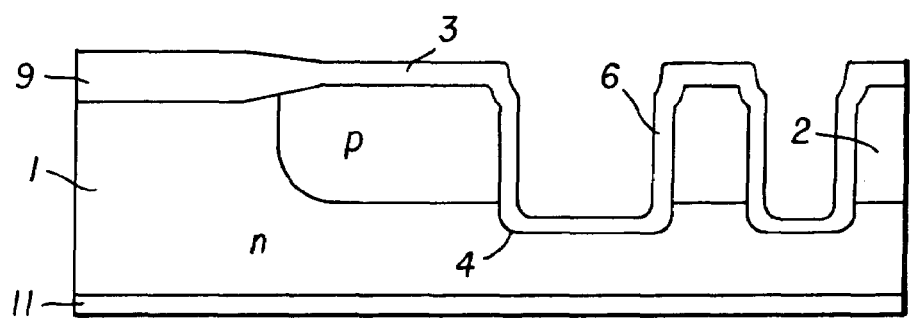
Figure 2E:
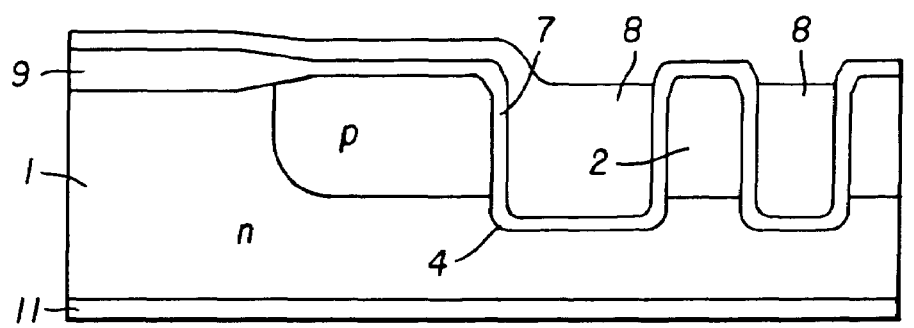
Figure 3A:
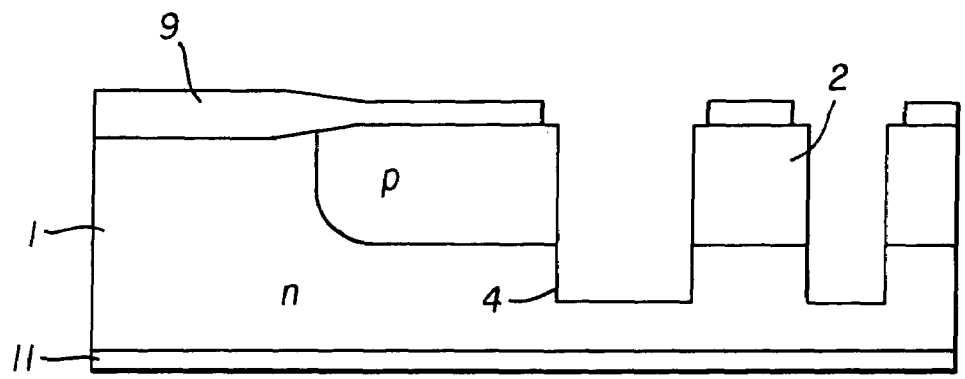
FIGS. 3A to 3C are cross sectional views showing in successive steps, arrangements of a trench MOS semiconductor device in the course of manufacturing the semiconductor device according to another related method.
Figure 3B:
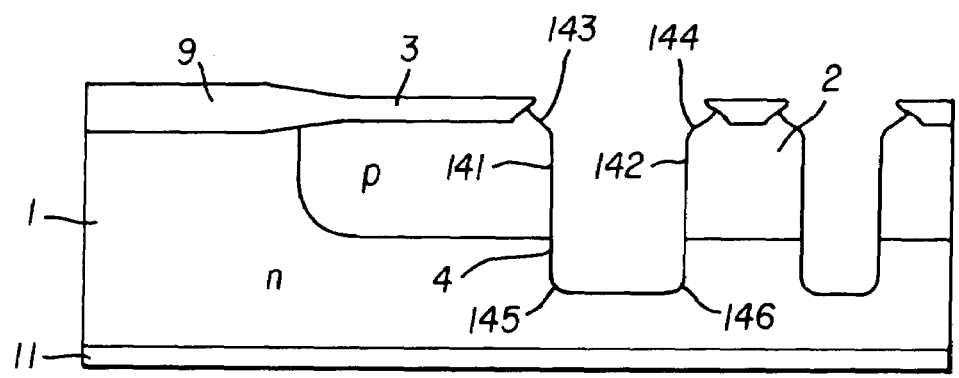
Figure 3C:
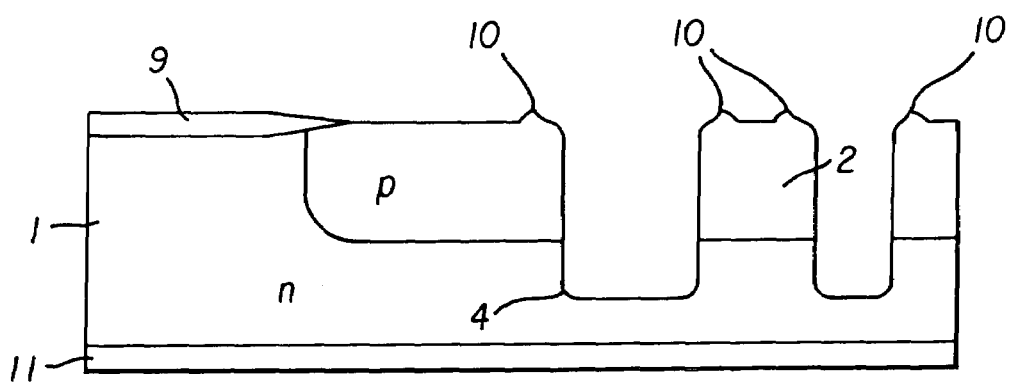
Figure 4:
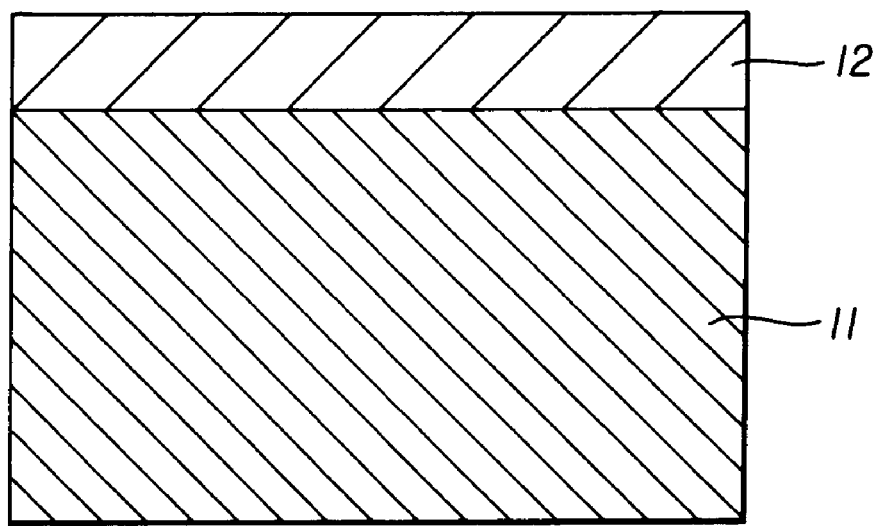
FIG. 4 is a cross sectional view showing an arrangement of a trench MOS semiconductor device in the course of manufacturing a first embodiment of a semiconductor device according to the present invention.

FIG. 4 to FIG. 8 illustrate cross sectional views each showing an arrangement of a trench MOS semiconductor device in each of successive steps in the course of manufacturing a first embodiment of a semiconductor device according to the present invention. First, on a silicon semiconductor substrate 11, a well region (not shown) is formed according to a conventional process of forming a MOS semiconductor device. Next, on the surface of the semiconductor substrate 11, a film, for example, a silicon dioxide film 12, which will become a mask, is formed (FIG. 4).

Figure 5:
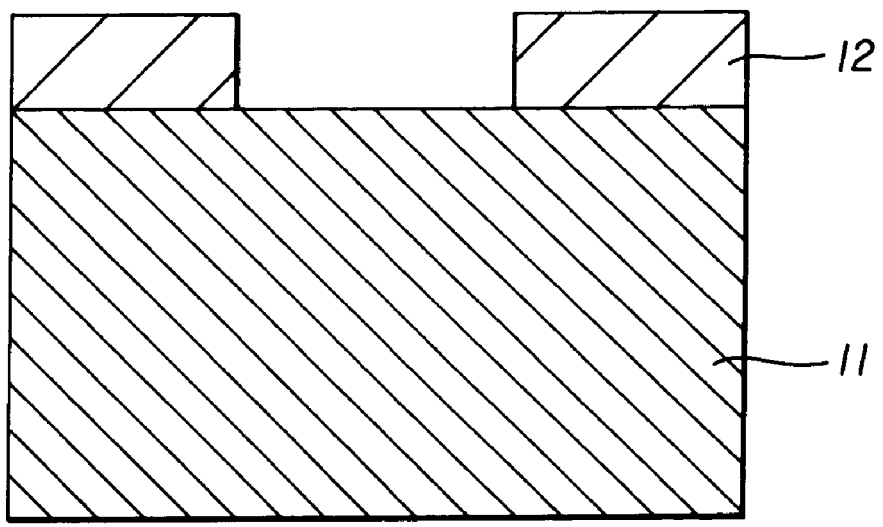
FIG. 5 is a cross sectional view showing an arrangement of the trench MOS semiconductor device following the step shown in FIG. 4.
Figure 6:
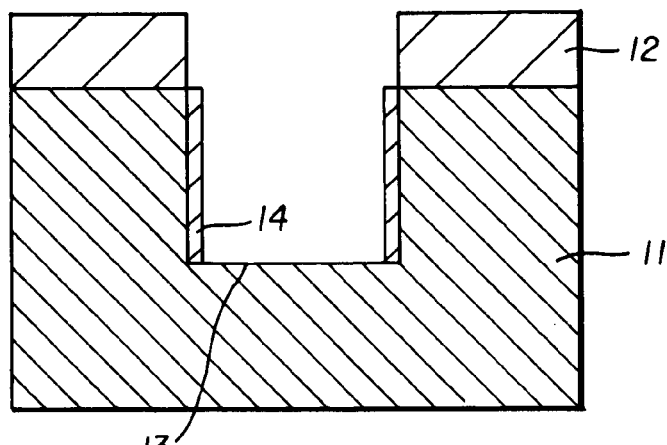
FIG. 6 is a cross sectional view showing an arrangement of the trench MOS semiconductor device following the step shown in FIG. 5.

Subsequently, on a surface of the silicon dioxide film 12, a mask of photoresist (not shown) is formed with a pattern having an opening provided therein for forming a trench forming region. By using the resist mask, the silicon dioxide film 12 is etched to form a mask with a specified trench pattern (FIG. 5). By using the mask, the silicon semiconductor substrate 11 is etched by anisotropic etching with, for example, reactive ion etching to form a trench 13 (FIG. 6) and a side wall protective film 14 of $SiO_2$. Then, the side wall protective film 14 and the silicon dioxide film 12 are both etched using an HF etchant. Subsequently, the resulting processed substrate was cleaned with water and spin dried.

Figure 7:
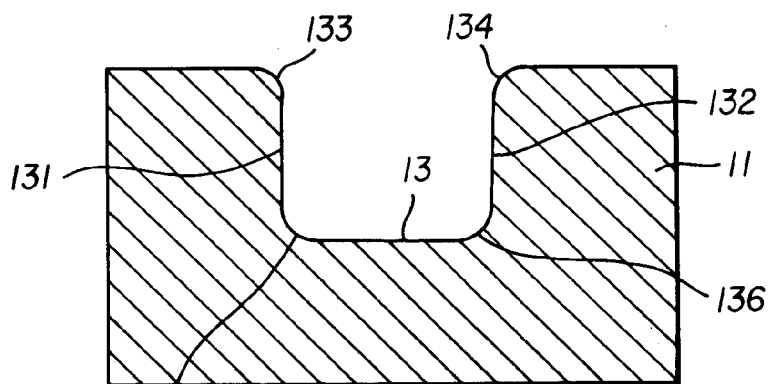
FIG. 7 is a cross sectional view showing an arrangement of the trench MOS semiconductor device following the step shown in FIG. 6.

Next, in an inert atmosphere under a normal pressure but at an elevated temperature of between 900° C. and 1050° C., the processed substrate is annealed for a time of between 30 seconds and 30 minutes. The inert atmosphere can be an atmosphere of any one of, for example, argon, helium, and neon. Alternatively, the inert atmosphere can be an atmosphere of a gas mixture that includes any one of argon, helium, and neon, and hydrogen of 4% or less. The % used here refers to % by volume. By exposing the processed substrate in such an atmosphere containing hydrogen, a surface of silicon is brought into an inactive state with hydrogen termination, by which influence contamination can be reduced. With such an atmosphere made inert under a normal pressure, no particular explosion-proof system is necessary to allow use of an ordinary heat treatment system. Silicon does not react with an inert atmosphere under a normal pressure. During the annealing step, silicon atoms migrate to the surface to planarize the trench side walls 131 and 132, while rounding the trench corners 133, 134, 135, and 136 (FIG. 7). Furthermore, crystalline defects are eliminated.

Here, the reason for the annealing at the prescribed temperature range is that a temperature less than 900° C. causes only a few migrations of the silicon atoms, providing little planarization effect on the trench side walls 131 and 132, and little rounding effect on the trench corners 133, 134, 135, and 136. On the other hand, a temperature exceeding 1050° C. causes the trench to be formed with a reversed taper due to bowing, which undesirably produces voids when polycrystalline silicon is later buried in the trench 14.

Moreover, the reason for annealing within the prescribed time range is that a time less than 30 seconds is too short to provide sufficient planarization effect on the trench side walls 131 and 132 and rounding effect on the trench corners 133, 134, 135 and 136. On the other hand, a time exceeding 30 minutes causes the trench to be formed with a reversed taper due to bowing, which again undesirably produces voids as explained above at the time of burying the trench 13.

Figure 8:
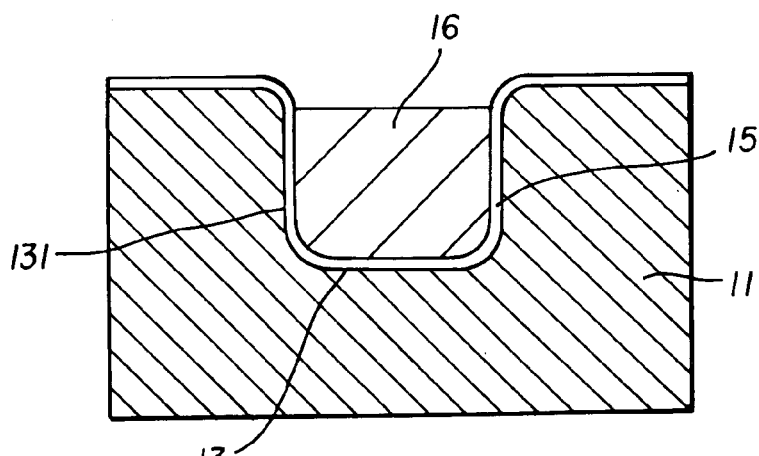
FIG. 8 is a cross sectional view showing an arrangement of the trench MOS semiconductor device following the step shown in FIG. 7.

Thereafter, a gate insulator film 15 is formed and then polycrystalline silicon 16 is buried in the trench 13 (FIG. 8). Then, although not shown in the figure, a source and a drain are formed with further formation of an interlayer insulator film, metal wiring, and a passivation film, by which a trench MOS semiconductor device (not shown) is completed.

Figure 9:
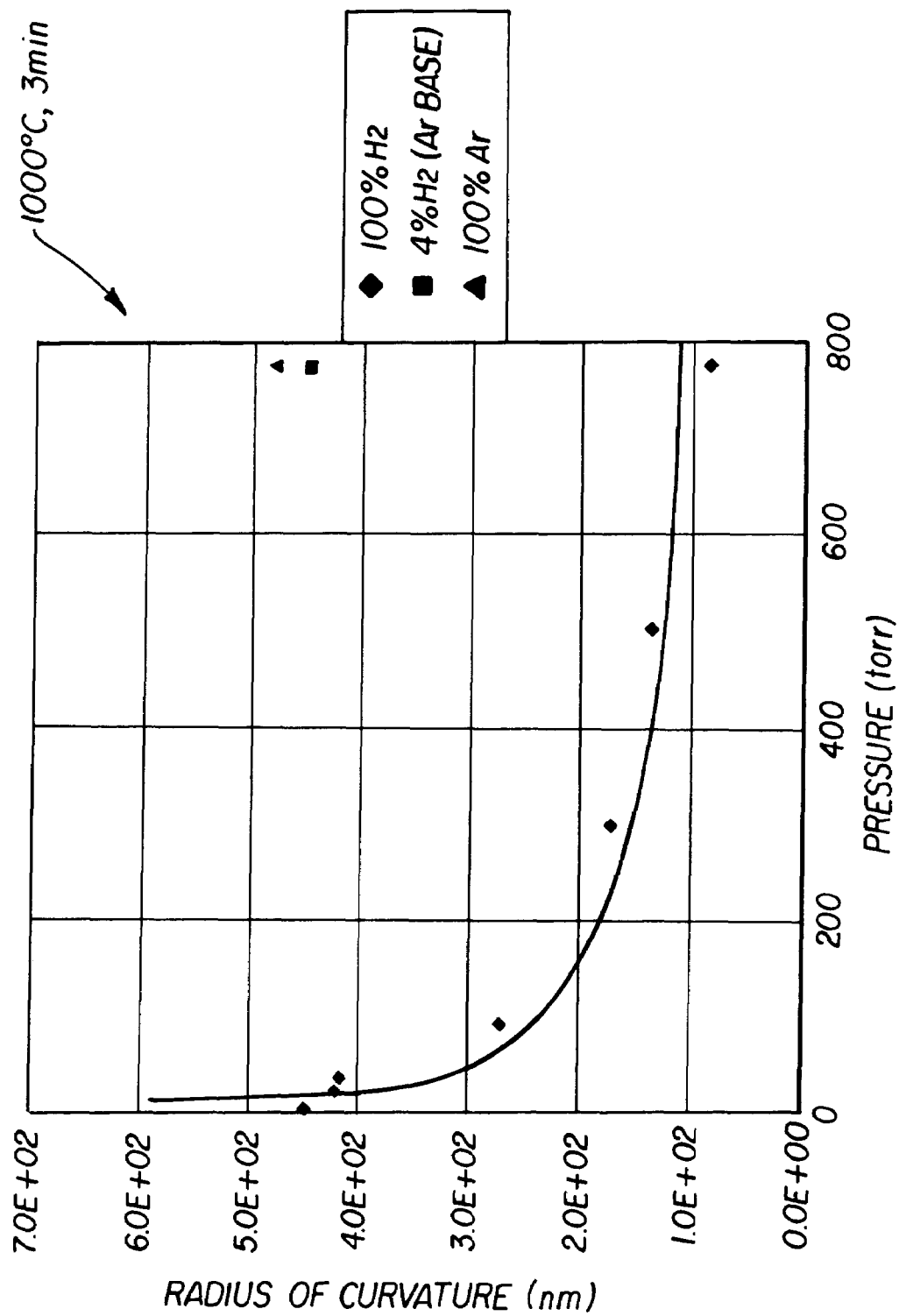
FIG. 9 is an explanatory view showing pressure dependence of a radius of curvature of a trench corner of a trench MOS semiconductor device manufactured by the method of manufacturing a semiconductor device according to the first embodiment of the invention.

In the first Example, according to the embodiment formed above, the annealing step was carried out in each of an atmosphere of argon at a normal pressure of 760 torr and an atmosphere of a gas mixture of argon and 4% of hydrogen at the normal pressure. The formed substrate was annealed at a temperature of 1000° C. for 3 minutes. FIG. 9 shows radii of curvatures at the trench corner at the normal pressure for the argon-based atmospheres in comparison to those for an atmosphere of 100% hydrogen at different pressures. FIG. 9 illustrates that the present method allows the trench corner to be easily rounded at the normal pressure, whereas the 100% hydrogen atmosphere did not sufficiently allow rounding of the trench corner at the normal pressure. Indeed, when using the 100% hydrogen atmosphere, to achieve the same rounding effect as in the present method, the atmospheric pressure needs to be at significantly less than the normal pressure, more like at less than 50 torr.

According to the above-explained method, after the trench 13 is formed and the side wall protective film 14 is removed, the annealing processing at an elevated temperature is carried out in an inert atmosphere to allow migrations of silicon atoms to planarize the trench side walls 131 and 132 at the atomic level and round the trench corners 133, 134, 135, and 136. This reduces variation in a gate breakdown voltage to increase the gate breakdown voltage. Therefore, reliability of the trench MOS semiconductor device is increased to improve yield thereof. Moreover, no explosion-proof system becomes necessary for the heat treatment apparatus to allow the annealing processing to be carried out easily and inexpensively.

In the foregoing first embodiment, the explanation was made in reference to a trench MOS semiconductor device. The invention, however, is not limited to the MOS device, but can be applied to any semiconductor device needing a trench formed on a semiconductor substrate, for example, a capacitor with an electrode formed in a trench with an insulator film formed between the electrode and the trench.

Figure 10:
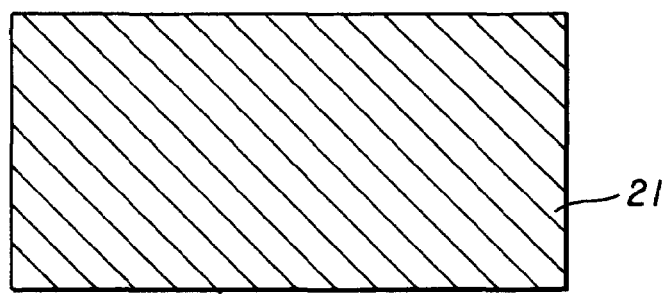
FIG. 10 is a cross sectional view showing an arrangement of a planar MOS semiconductor device in the course of manufacturing a second embodiment of a semiconductor device according to the present invention.
Figure 11:
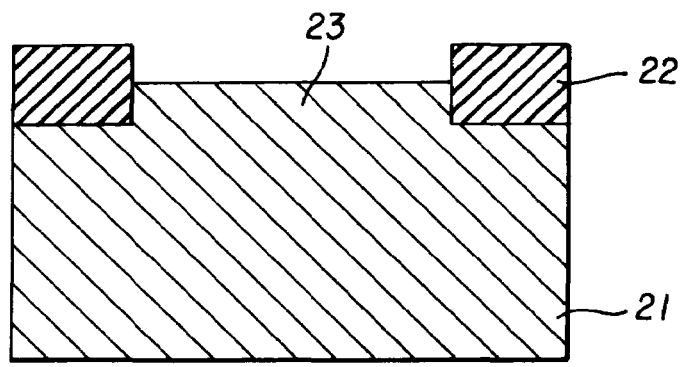
FIG. 11 is a cross sectional view showing an arrangement of the planar MOS semiconductor device following the step shown in FIG. 10.
Figure 12:
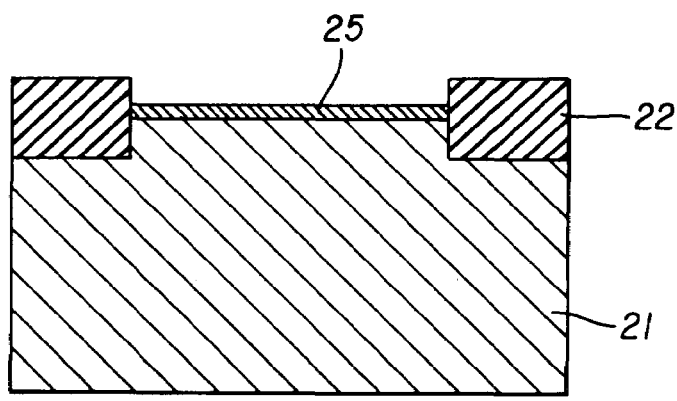
FIG. 12 is a cross sectional view showing an arrangement of the planar MOS semiconductor device following the step shown in FIG. 11.

FIG. 10 to FIG. 12 illustrate cross sectional views each showing an arrangement of a planar MOS semiconductor device in each of successive steps in the course of manufacturing a second embodiment of the semiconductor device according to the present invention. First, on a silicon semiconductor substrate 21, a well region (not shown) is formed according to a conventional process of forming a MOS semiconductor device (FIG. 10). Moreover, a LOCOS oxide film 22 is formed (FIG. 11).

Subsequently, a silicon surface of a gate insulator film forming region 23 is exposed to an inert atmosphere under a normal pressure at an elevated temperature of between 900° C. and 1050° C., annealing being carried out for a time of between 30 seconds and 15 minutes. The inert atmosphere can be, in the same way as that in the first embodiment, any one of atmospheres of argon, helium, and neon. Alternatively, the inert atmosphere can be an atmosphere of a mixed gas including any one of argon, helium, and neon, and hydrogen of 4% or less.

Here, the reason for the upper limit of the prescribed time of annealing being shorter than that in the first embodiment is that, in the second embodiment, the gate insulator film is formed on the surface of the silicon semiconductor substrate 21, which surface has more small roughness and more small crystalline defects than those of the trench side wall in the first embodiment. Thus, a lighter processing than that for the trench is sufficient in the second embodiment.

After the annealing processing, a gate insulator film 25 is formed in the gate insulator film forming region 23 (FIG. 12). Then, although not particularly shown in the figure, a polysilicon electrode, an interlayer insulator film, metal wiring, and a passivation film are formed, by which a planar MOS semiconductor device (not shown) is completed.

According to the above-explained second embodiment, the annealing processing at an elevated temperature is carried out in an inert atmosphere so that migrations of silicon atoms planarize the gate insulator film forming region 23 at atomic level. This increases Qbd. The Qbd is an index of reliability of the insulator film represented by a quantity of electric charges that can be made to flow until dielectric breakdown occurs. Therefore, reliability of the planar MOS semiconductor device is increased to improve yield thereof. Moreover, no explosion-proof system becomes necessary for the heat treatment apparatus to allow the annealing processing to be carried out easily and inexpensively.

FIGS. 13A to 13F illustrates cross sectional views each showing in successive steps arrangement of a trench MOS semiconductor device in the course of manufacturing a third embodiment of the semiconductor device according to the present invention.

Figure 13A:
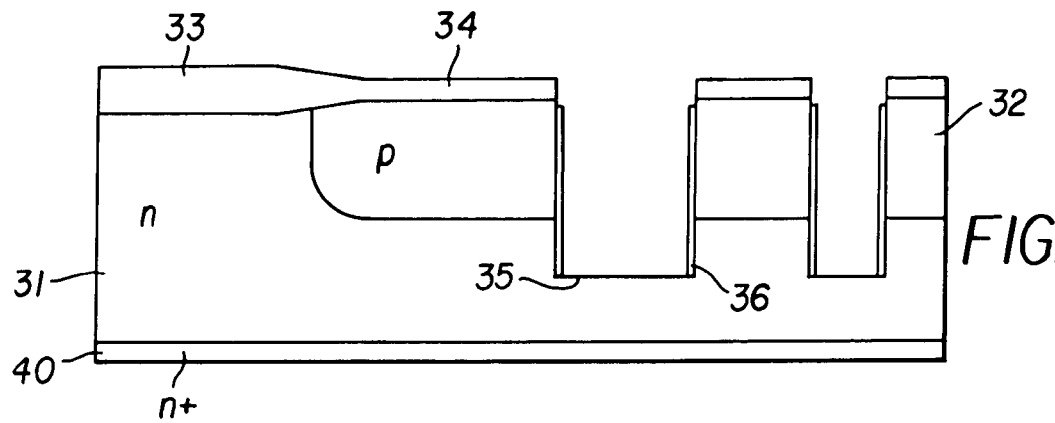
FIGS. 13A to 13F illustrate cross sectional views showing in successive steps, arrangements of a trench MOS semiconductor device in the course of manufacturing a third embodiment of a semiconductor device according to the present invention.

First, on a silicon semiconductor substrate 31 provided with an $n^+$-drain 40, a thick oxide film 33 formed by thermal oxidation and a well region 32 are formed according to a conventional process of forming a MOS semiconductor device. On the thick oxide film 33, there is formed a contact section of a gate electrode that will be described later and metal wiring such as Al wiring (not shown). The thick oxide film 33 is provided as a thick oxide film so that an adverse effect to the gate insulator film is lessened. On a surface of the well region 32, there is formed a mask 34 of a silicon dioxide film with a desired pattern. Through an opening of the mask 34, the silicon semiconductor substrate 31 is subjected to trench etching by reactive ion etching to be formed into a trench 35 on the silicon semiconductor substrate 31. At this time, a side wall protective film 36 of $SiO_2$ series is formed on a side wall of the trench 35 (FIG. 13A).

Figure 13B:
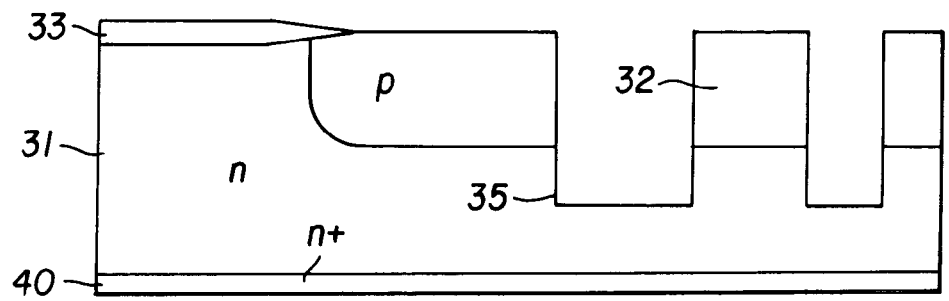
Figure 13C:
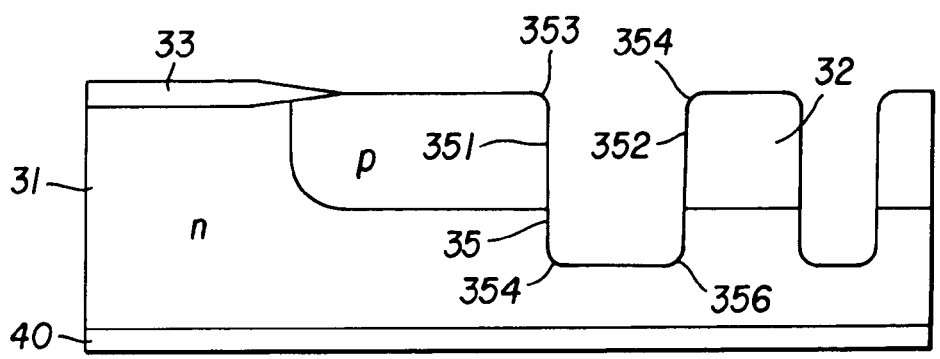

The side wall protective film 36 and the mask are then removed using an HF etchant. The thick oxide film 33 is maintained (FIG. 13B). Thereafter, in an inert atmosphere, annealing processing is carried out. The inert atmosphere can be any one of atmospheres of, for example, argon, helium, and neon under a normal pressure. Alternatively, the inert atmosphere can be an atmosphere of a gas mixture that includes any one of argon, helium, and neon, and hydrogen of 4% or less, or can be an atmosphere of 100% hydrogen under a reduced pressure. During the annealing processing, surface migrations of silicon atoms planarize side walls 351 and 352 of the trench 35, while rounding the trench corners 353, 354, 355, and 356 (FIG. 13C). Furthermore, crystalline defects are eliminated.

Figure 13D:
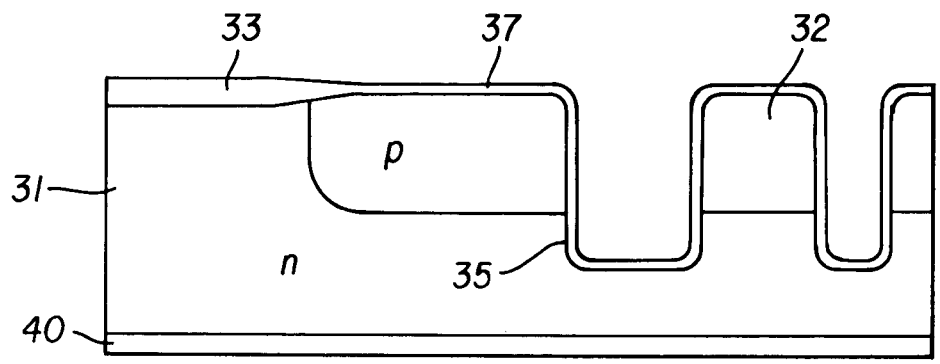

Subsequently, for the purpose of removing foreign materials in the trench 35, a sacrifice oxide film 37 is formed by thermal oxidation on the substrate 31, covering the well region 32 and the trenches 35 (FIG. 13D). The sacrifice oxide film 37, need not round the corners at an upper part of the trench. Accordingly, it can be formed thin so that the time for thermal oxidation can be shortened.

Incidentally, in the thermal oxidation in forming the sacrifice oxide layer 37, a rate of formation of the oxide film by thermal oxidation is higher in the surface of the semiconductor substrate 31 than in the surface of the thick oxide film 33. This provides a thicker oxide film on the surface of the semiconductor substrate 31. However, in removing the sacrifice oxide film 37, the same thicknesses are removed both in the thick oxide film 33 and in the sacrifice oxide film 37 formed on the semiconductor substrate 31. Thus, the removal of the sacrifice oxide film 37 causes the thick oxide film 33 to be thinner than before the sacrifice oxide film 37 is formed. Therefore, the thick oxide film 33 must be made thicker taking the thinning effect into consideration.

Nevertheless, as explained before, the sacrifice oxide film 37 can be made thinner than that provided in the related methods. This reduces the amount of removal of the thick oxide film 33 when the sacrifice oxide layer 37 is removed. Therefore, the thick oxide film 33 can be formed thinner than that formed by the related methods to shorten the thermal oxidation step.

Figure 13E:
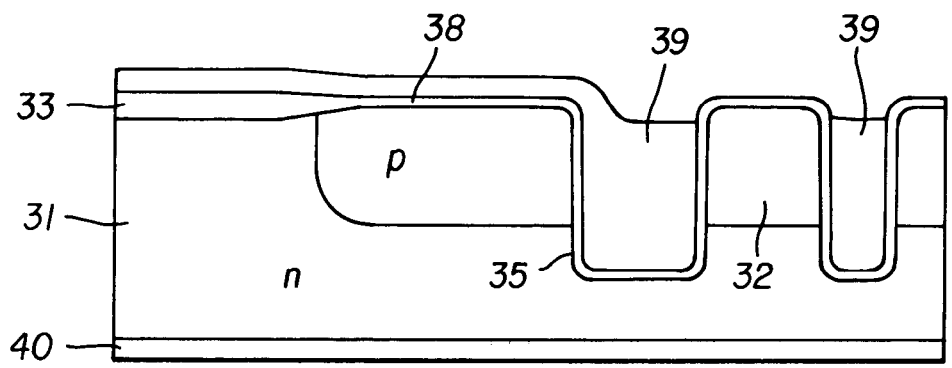
Figure 13F:
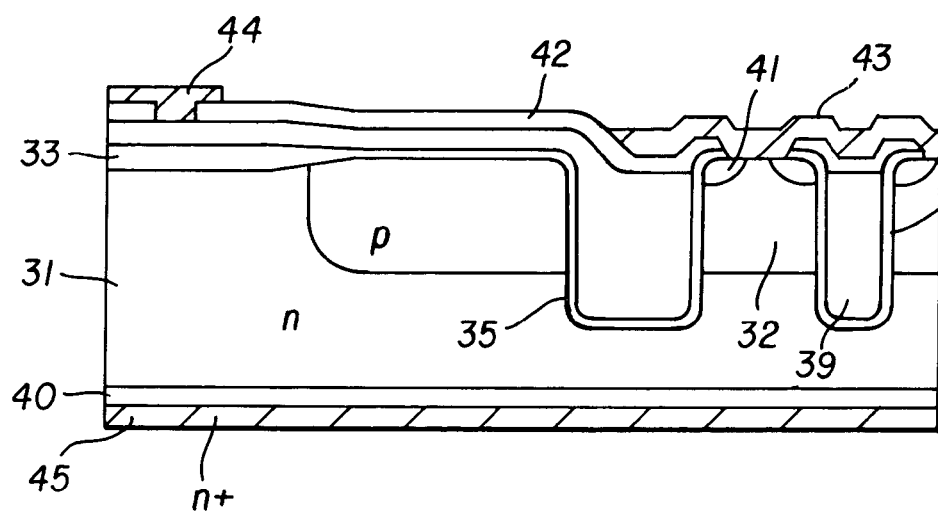

By removing the sacrifice oxide film 37, foreign materials are also removed. Thereafter, a gate insulator film 38 is formed, and the trench 35 is filled with polycrystalline silicon 39, which is then etched back (FIG. 13E). Subsequently, a source 41 is formed and an interlayer insulator film 42 of material such as BPSG is formed. After the interlayer insulator film 42 is patterned, a source electrode 43, a gate pad 44, and a drain electrode 45 are formed, by which a trench MOS semiconductor device is formed (FIG. 13F).

In the third embodiment, although the mask 34 was removed at the same time as the removal of the side wall protective film 36, a distance between the thick oxide film 33 remaining without being removed, and the trench must be taken into consideration. The distance is desirable to be as two times or greater than the radius of curvature of each of the corners 353 and 354, which are rounded by the annealing processing in the inert atmosphere, at the upper part of the trench.

Thus, it is desirable for the surface of the semiconductor substrate 31 around the trench 35 to be exposed before the annealing processing so that the distance from the trench 35 is two times or greater than the radius of curvature of each of the corners, which are rounded by the annealing processing, at the upper part of the trench 35.

In the second Example, in forming the third embodiment, annealing processing was carried out in an atmosphere of 100% hydrogen under a pressure of 40 Torr. The distance from the trench to the thick oxide layer was 7 µm. The processing temperature and the processing time were 1000° C. and 3 minutes, respectively. In observing the resulting cross sectional shape of the device was observed using an FIB (focused ion beam) apparatus, it is ascertained that the surface was made smoother than that provided by the related methods.

Under the condition of the above-described Example 2, 100 pieces of the MOSFETs were manufactured each of which was subjected to the annealing processing. Characteristics of the gate insulator film of the MOSFET were evaluated by TZDB (Time Zero Dielectric Breakdown) by applying the voltage to the gate electrode. For the purpose of comparison, 100 pieces of MOSFETs were manufactured, each of which was subjected to the annealing processing similar to that in the Example 2, but without removing the mask used for forming the trench, and evaluated in the same way as Example 2. The results of the evaluation proved that the gate breakdown voltage yield was improved from 70% up to 90% by the present Example 2.

According to the above-explained third embodiment, by the annealing processing in the inert atmosphere, a surface obtained is smoother when compared with a surface obtained by the related methods. This inhibits a dielectric breakdown at the gate electrode to increase reliability of the trench MOS semiconductor device.

Although the third embodiment was explained as a trench MOS semiconductor device, a similar effect can be obtained in a semiconductor device having an arrangement in which an electrode is formed in a trench with an insulator film formed between the electrode and the trench, and the electrode is taken out onto the surface of the semiconductor around the trench. The third embodiment can be further applied to a method of manufacturing a semiconductor device in which a trench is formed in a semiconductor substrate and annealing processing with an inert atmosphere is carried out.

According to the present invention, migrations of silicon atoms at the annealing processing perform planarization of the trench side wall at atomic level and perform rounding of a portion with a small radius of curvature such as the trench corner. Thus, for example, in a trench MOS semiconductor device, variation in a gate breakdown voltage is reduced to increase the gate breakdown voltage. Moreover, in a planar MOS semiconductor device, the above-explained Qbd is increased. Therefore, the reliability of the semiconductor device, subjected to annealing processing in an inert atmosphere, is increased to improve yield thereof.

Furthermore, according to the invention, no explosion-proof system becomes necessary during the heat treatment to allow the annealing processing to be carried out easily and inexpensively.

In addition, in a semiconductor device with an arrangement in which an electrode, formed in a trench with an insulator film provided between the trench and the electrode, is taken out around the trench, a mask for forming the trench is removed before carrying out annealing processing in an inert atmosphere, by which a semiconductor device with high reliability can be provided while inhibiting dielectric breakdown.

While the invention has been particularly shown and described with reference to preferred embodiments thereof, it will be understood by those skilled in the art that the foregoing and other changes in form and details can be made therein without departing from the spirit and scope of the invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications, JP PA 2002-086122 and JP PA 2003-036685, in their entirety, including the drawings, claims, and the specifications thereof, are incorporated herein by reference.

What is claimed is:

1. A method of manufacturing a semiconductor device comprising the steps of:
    forming a mask on a semiconductor substrate
    forming a trench on the semiconductor substrate by etching with the mask
    removing the entire mask from the semiconductor substrate;
    annealing the substrate in an inert atmosphere to round corners of the trench and to planarize side walls of the trench after the mask is removed; and
    forming an electrode in the trench and on a surface of the semiconductor substrate continuous with the trench, with an insulator layer formed under the electrode.

2. The method of manufacturing a semiconductor device as claimed in claim 1, further comprising the steps of:
    forming a sacrifice oxide film after annealing the substrate; and
    removing the sacrifice oxide film.

3. The method of manufacturing a semiconductor device as claimed in claim 1, wherein the substrate is annealed at a temperature of between 900° C. and 1050° C.

4. The method of manufacturing a semiconductor device as claimed in claim 3, wherein the substrate is annealed for a time of between 30 seconds and 30 minutes.

5. A method of manufacturing a semiconductor device comprising:
   forming a mask on a semiconductor substrate;
   forming a trench on the semiconductor substrate by etching with the mask;
   removing the entire mask from the semiconductor substrate;
   annealing the substrate in an inert atmosphere to round corners of the trench and to planarize side walls of the trench after the mask is removed; and
   forming an electrode in the trench and on a surface of the semiconductor substrate continuous with the trench, with an insulator layer formed under the electrode,
   wherein the inert atmosphere is an atmosphere containing one of argon, helium, and neon.

6. A method of manufacturing a semiconductor device comprising:
   forming a mask on a semiconductor substrate;
   forming a trench on the semiconductor substrate by etching with the mask;
   removing the entire mask from the semiconductor substrate;
   annealing the substrate in an inert atmosphere to round corners of the trench and to planarize side walls of the trench after the mask is removed; and
   forming an electrode in the trench and on a surface of the semiconductor substrate continuous with the trench, with an insulator layer formed under the electrode,
   wherein the inert atmosphere is an atmosphere of a gas mixture containing hydrogen of 4% or less and one of argon, helium, and neon.

7. A method of manufacturing a semiconductor device comprising:
   forming a mask on a semiconductor substrate;
   forming a trench on the semiconductor substrate by etching with the mask;
   forming a side wail protective film on the sides of said trench;
   removing the entire mask and the side wall protective film;
   annealing the substrate in an inert atmosphere to round corners of the trench and to planarize side walls of the trench after the mask is removed; and
   forming an electrode in the trench and on a surface of the semiconductor substrate continuous with the trench, with an insulator layer formed under the electrode.

8. A method of manufacturing a semiconductor device according to claim 7, wherein said mask is a silicon dioxide mask.

9. A method of manufacturing a semiconductor device according to claim 8, wherein said side wall protective film comprises silicon dioxide.

10. A method of manufacturing a semiconductor device according to claim 7, wherein said side wall protective film comprises silicon dioxide.

11. A method of manufacturing a semiconductor device according to claim 7, wherein the inert atmosphere is an atmosphere containing one of argon, helium, and neon.

12. A method of manufacturing a semiconductor device according to claim 7, wherein the inert atmosphere is an atmosphere of a gas mixture containing hydrogen of 4% or less and one of argon, helium, and neon.

13. A method of manufacturing a semiconductor device comprising the steps of:
   forming a thick oxide selectively on a semiconductor substrate;
   forming a well region on portions of a surface layer of semiconductor substrate on which the thick oxide film is not formed;
   forming a mask on a semiconductor substrate
   forming a trench on the semiconductor substrate by etching with the mask;
   removing the entire mask from the semiconductor substrate;
   annealing the substrate in an inert atmosphere to round corners of the trench and to planarize side walls of the trench after the mask is removed; and
   forming an electrode in the trench and on a surface of the semiconductor substrate continuous with the trench, with an insulator layer formed under the electrode.

* * * * *